United States Patent [19]

Boskamp

[11] Patent Number: 5,696,449
[45] Date of Patent: Dec. 9, 1997

[54] RF COIL FOR OPEN MR MAGNET

[75] Inventor: Eddy B. Boskamp, Menomonee Falls, Wis.

[73] Assignee: General Electric Company, Milwaukee, Wis.

[21] Appl. No.: 659,109

[22] Filed: Jun. 3, 1996

[51] Int. Cl.[6] .................................................. G01V 3/00
[52] U.S. Cl. .................................. 324/318; 128/653.5
[58] Field of Search .................................. 324/318, 322, 324/314, 307, 309; 128/653.5, 653.2

[56] References Cited

U.S. PATENT DOCUMENTS

| | | | |
|---|---|---|---|
| 4,680,548 | 7/1987 | Edelstein et al. | 324/318 |
| 4,692,705 | 9/1987 | Hayes | 324/318 |
| 4,752,738 | 6/1988 | Patrick et al. | 324/318 |
| 5,045,792 | 9/1991 | Mehdizadeh | 324/318 |
| 5,050,605 | 9/1991 | Eydelman et al. | 324/318 |
| 5,365,927 | 11/1994 | Roemer et al. | 128/653.2 |
| 5,473,251 | 12/1995 | Mori | 324/318 |

OTHER PUBLICATIONS

Circular Polarized RF Coils for Open Magnet Systems. I. Viohl,Ph.D. Book of Abstracts—3rd Annual Scientific Meeting of Society of Magnetic Resonance. p. 183 (Nice, France 1985).

*Primary Examiner*—Louis M. Arana
*Attorney, Agent, or Firm*—James O. Skarsten; John H. Pilarski

[57] ABSTRACT

A whole body RF coil provided for use with an open MR magnet system comprises first and second RF coil components selectively spaced apart from each other on opposite sides of an imaging space disposed to receive a subject, each of the RF coil components comprising a plurality of electrically conductive inner and outer arc segments which respectively lie on corresponding inner and outer circular paths. The RF coil is constructed to allow the subject to pass through the inner and outer circular paths of a selected one of the coil components or alternatively between the spaced apart RF coil components, into imaging space. The first and second RF coils are each energized in quadrature to generate respective corresponding first and second magnetic fields which collectively provide a resultant field comprising the $B_1$ field component required for imaging.

12 Claims, 5 Drawing Sheets

RF COIL FOR OPEN MR MAGNET

BACKGROUND OF THE INVENTION

The invention disclosed and claimed herein generally pertains to an RF coil system for use with an open magnetic resonance (MR) magnet, that is, a magnet which generates a main magnetic field for MR imaging in a space which is very accessible to a patient or other imaging subject, and is not enclosed within a magnet bore. More particularly, the invention pertains to a full body RF coil system for use in connection with an open MR magnet.

A very significant innovation in the field of MR imaging and magnetic resonance therapy (MRT) has been the development of the open MR magnet. Such magnet, as described for example in commonly assigned U.S. Pat. No. 5,365,927, issued to Roemer et al on Nov. 22, 1994, generally comprises two donut-shaped ring magnets or magnet components which are positioned on opposite sides of an imaging space. The two ring magnets are energized to provide a resultant field in the imaging space which comprises the static magnetic field for MR imaging. This configuration enables an imaging subject to enter and leave the space with much more convenience than the prior art closed bore arrangement. More specifically, the subject can enter the imaging space either by passing through the center of one of the ring magnets (front entry) or can enter directly into the space between them (side entry). Also, the subject can be seated in a chair during the imaging scan. Moreover, the open magnet arrangement enables attendant physicians to treat and closely monitor a subject while MR imaging is taking place.

Open MR magnets currently employ flexible surface coils for the RF transmit, or excitation, and receive coil. Such surface coils comprise a combination of single loops which provide linear or circular polarized fields. However, transmit surface RF coils tend to have comparatively low homogeneity, particularly in a large field of view. Accordingly, it would be desirable to configure an RF coil system as a combination of a whole body transmission coil, to obtain high transmit uniformity, and surface coils for use as RF receive coils, to provide an arrangement having comparatively high excitation homogeneity in combination with large field of view. However, any such RF coil arrangement must avoid placing conductors across the path of either forward or side entry, so that accessibility into the imaging space will be maintained. Also, in addition to high homogeneity, the whole body RF coil must be able to provide a circular polarized field in the transverse plane, i.e., the plane which is generally orthogonal to the axis of a DC magnetic field extending between the two ring components of the open magnet.

Moreover, such arrangement must not exceed FDA specified absorption ratio (SAR) limits. As is known to those of skill in the art, SAR pertains to the level of electromagnetic energy which can be absorbed by a patient or medical personnel positioned in or close to the transmit RF coil of an MR system.

SUMMARY OF THE INVENTION

The invention is directed to an RF coil system for use with an open MR magnet comprising a pair of main magnet components positioned on opposing sides of an imaging space disposed to receive at least a portion of a subject for imaging. The RF coil system comprises first and second RF coil halves or components likewise positioned on opposing sides of the imaging space, each of the RF coil components comprising a plurality of conductive closed loops. The closed loops of each of the RF coil components include inner and outer conductive arc segments, respectively lying in planes which are substantially parallel to one other. The RF coil system further comprises means for energizing the closed loops of the first and second RF coil components to generate respective corresponding first and second magnetic fields which collectively provide a resultant field comprising a circular polarized field. The circular polarized field lies in a plane which intersects the imaging space and is substantially parallel to the planes respectively containing the inner and outer arc segments. Preferably, the planes associated with each RF coil component are separated from each other by a specified distance along an axis orthogonal to the planes.

In one embodiment of the invention, which has been found to be particularly useful in increasing sensitivity, the inner and outer arc segments of a given one of the closed conductive loops are connected together by a pair of conductive elements extending therebetween to form the given conductive loop, wherein the extending conductive elements are electrically isolated from conductive elements of other closed loops. Each of the RF coil components has an associated pair of orthogonal reference axes, and comprises a pair of first closed loops positioned along one of its associated axes, in spaced apart opposing relationship, and a pair of second closed loops positioned along its other associated axis in spaced apart opposing relationship. The energizing means comprises means for coupling a first energizing signal to each of the first closed loops of the RF coils and a second energizing signal to each of second closed loops of the coil. The first and second energizing signals are substantially the same, except that they are 90 degrees out of phase with respect to one another. Thus, the first and second loops are driven in quadrature, the first energizing signal being commonly referred to as an I-channel signal, and the second energizing signal being commonly referred to as a Q-channel signal.

In a second embodiment of the invention, which has been found useful in improving homogeneity, the inner and outer arc segments of a given one of the closed conductive loops are connected together by a pair of conductive elements extending therebetween in like manner with the first embodiment. In this embodiment, however, each of the extending conductive members also serves to interconnect the inner and outer arc segments of a closed conductive loop which is adjacent to the given closed loop. The second embodiment usefully comprises a modification of an RF coil known in the art as a bird cage coil, as shown, for example, in commonly assigned U.S. Pat. No. 4,692,705, issued Sep. 8, 1987 to C. E. Hayes. Such embodiment is likewise driven in quadrature.

It is seen that the RF coil of the invention comprises a set of coil components or coil halves, positioned in spaced apart relationship on opposing sides of the imaging space, and each proximate to a corresponding one of the two magnet poles or magnet components of an open magnet system. Thus, the RF coil system does not inhibit side entry into the open magnet, since a patient can be easily moved through the space between the RF coil components. At the same time, the inner arc segments of each RF component are positioned along a common circular path. The radius of such circular path is made large enough to allow front entry into the open magnet, i.e., to allow a patient to pass through the circular path into the imaging space. Thus, the RF coil of the invention readily permits both front and side entry into the open magnet without any need to change or readjust the RF coil components.

Moreover, the resultant field produced by the RF coil components, comprising the RF $B_1$ field, is contributed by the fields of both RF coil components. The field $B_1$ is thereby made strong enough to provide a comparatively high level of sensitivity.

OBJECTS OF THE INVENTION

An object of the invention is to provide a whole body RF excitation coil for use in an MR imaging arrangement which employs an open magnet.

Another object is to provide an RF coil system for use, in connection with an open MR magnet, which achieves significantly improved homogeneity in combination with a large field of view.

Another object is to provide an RF coil of the above type which does not diminish accessibility or freedom of movement of a patient or imaging subject with respect to the imaging space of the open MR magnet.

Another object is to provide an RF coil of the above type having two components on opposing sides of the imaging space, without requiring any conductors or other structure connecting them which could block or impede either front or side entry into the imaging space.

These and other objects of the invention will become more readily apparent from the ensuing specification, taken together with the accompanying drawings.

DETAILED DESCRIPTION OF THE PREFERRED EMBODIMENT

Figure 1:
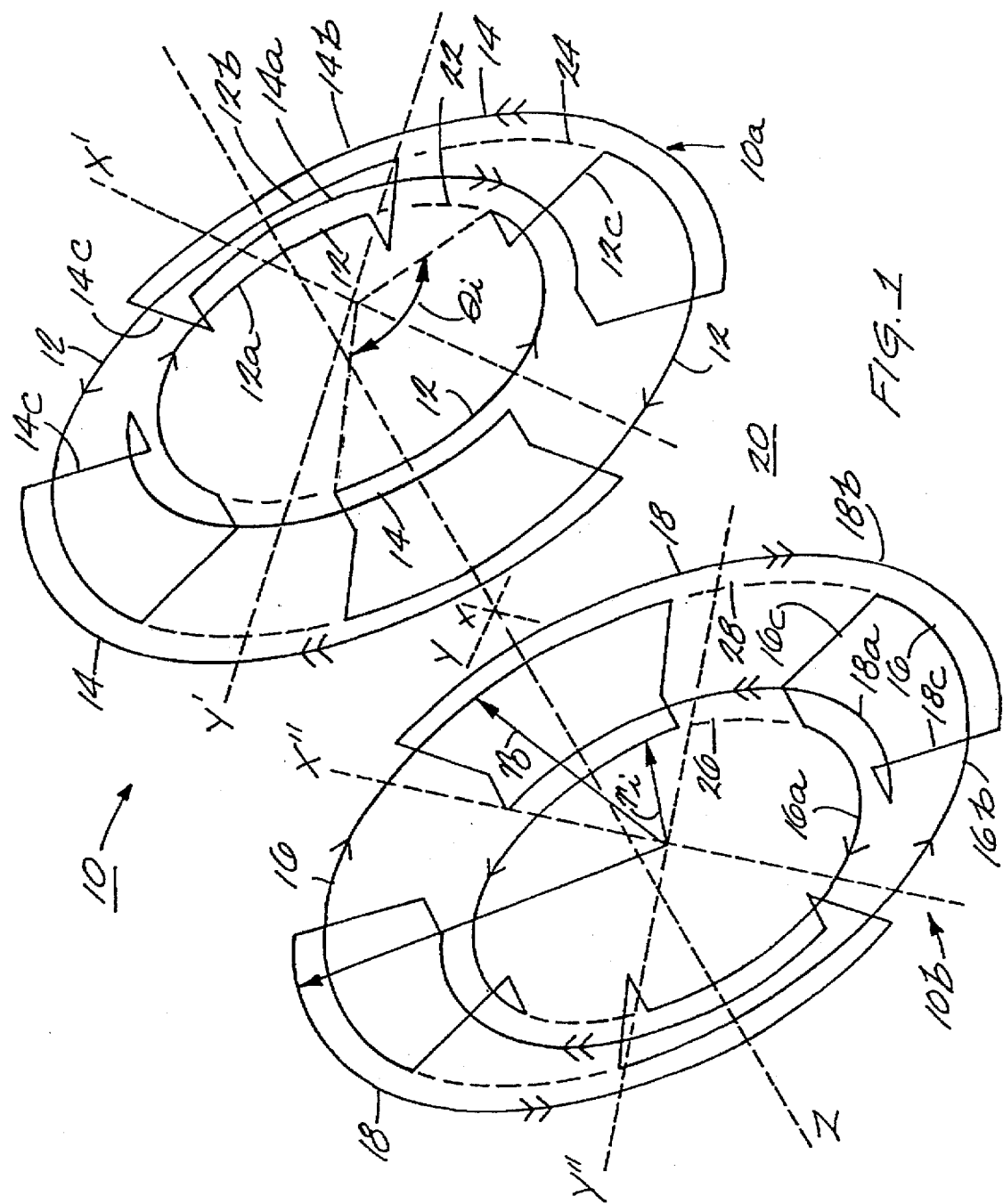
FIG. 1 is a simplified perspective view showing an embodiment of the invention, wherein certain components thereof are spaced apart from one another for purposes of illustration.

Referring to FIG. 1, there is shown an RF coil system 10, constructed in accordance with the invention, for use with an open MR magnet such as described hereinafter in connection with FIG. 6. Coil system or antenna 10 generally comprises RF coil components 10a and 10b, which are spaced apart from one another along the Z-axis of the open magnet system on opposing sides of the imaging space 20 thereof. RF coil 10a comprises two I-channel conductive loops 12 in spaced apart relationship with each other along an axis X' parallel to the X-axis of the open magnet system, and further comprises two Q-channel loops 14 in spaced apart relationship with each other along an axis Y' parallel to the Y-axis of the magnet system. Similarly, RF coil 10b comprises two I-channel conductive loops 16 in spaced apart relationship with each other along an axis X" parallel to the X-axis, and two Q-channel conductive loops 18 in spaced apart relationship with each other along an axis Y" parallel to the Y-axis.

Each of the closed loops 12 comprises an electrically conductive inner arc segment 12a and a conductive outer arc segment 12b, wherein each end of an inner arc segment 12a is connected to a corresponding end of an outer arc segment 12b by means of a conductive element 12c. In like manner, FIG. 1 shows each of the closed loops 14, 16, and 18 respectively comprising inner arc segments 14a, 16a, and 18a, outer arc segments 14b, 16b, and 18b, and conductive elements 14c, 16c, and 18c.

Referring further to FIG. 1, the inner arc segments 12a are shown to lie along a common circular path 22, while the inner arc segments 14a are shown to be spaced apart from the path 22. However, it is to be understood that such spacing is shown only for the purpose of illustrating each of the arc segments 12a and 14a in its entirety. In fact, each of the inner arc segments 14a also substantially lies on circular path 22, i.e., segments 14a lie as closely along circular path 22 as permitted by the particular cross-sectional dimensions of the inner arc segments 12a and 14a.

While the angle $\theta_i$ selected for each of the inner arc segments 12a and 14a may vary for different embodiments of the invention, it has been found that a very useful value of $\theta_i$ is on the order of 140 degrees. Moreover, it has been found advantageous to center the two inner arc segments 12a along an axis X', and to center inner arc segments 14a along axis Y'. Thus, there is some overlap along the circular path 22 between inner arc segments 12a and 14a. The plane of circular path 22 is parallel to the X-Y plane of the MR system reference axes, and the Z-axis passes through the geometric center of the circular path 22.

In like manner, each of the outer arc segments 12b and 14b substantially lie along a circular path 24, each of the inner arc segments 16a and 18a lie along a circular path 26, and each of the outer arc segments 16b and 18b lie along circular path 28. The Z-axis likewise passes through the respective geometric centers of circular paths 24, 26, and 28, such paths respectively lying in planes parallel to the X-Y plane. The angle of each of the arc segments 12b and 14b, 16a and 18a, and 16b and 18b, preferably is the same as the angle of inner arc segments 12a and 14a, that is, 140 degrees. The radius $r_i$ of respective inner arc segments has usefully been found to be 30 centimeters, and the radius $r_o$ of respective outer arc segments has usefully been found to be 50 centimeters. A radius of 30 centimeters for $r_i$ is sufficiently large to enable a patient to be moved through the circular path 22 or 26, as described hereinafter. However, the invention is not limited to such values. It is to be noted further that the arc segments 12b and 14b are centered along the X' and Y' axes, respectively. Arc segments 16a and 16b are centered along axis X", and segments 18a and 18b are centered along axis Y".

It has been found that homogeneity of the resultant magnetic field produced by operation of RF coil components 10a and 10b, as hereinafter described, can be significantly improved by offsetting the plane of circular path 22, containing inner arc segments 12a and 14a, outwardly along the Z-axis relative to the plane of circular path 24, containing outer arc segments 12b and 14b. Each of the conductive elements 12c and 14c is provided with a 90 degree bend to achieve this. Preferably, the displacement between the two planes is on the order of 7.5–10.0 centimeters although the invention is by no means limited thereto. Similarly, the plane containing inner arc segments 16a and 18a is offset outwardly along the Z-axis, i.e., away from imaging space 20 in the opposite direction by a like displacement, with respect to the plane containing outer arc segments 16b and 18b.

FIG. 1 further shows the direction of current flow through respective loops 12, 14, and 18 when coils 10a and 10b are energized. As stated herein, the loops are energized in quadrature, that is, the same signals applied to loops 12 and 16 are also applied to loops 14 and 18, respectively, but delayed by ninety degrees in phase therefrom. The ninety degree phase delay is depicted in FIG. 1 by employing double-headed arrows to show current flow around loops 14 and 18.

Figure 2:
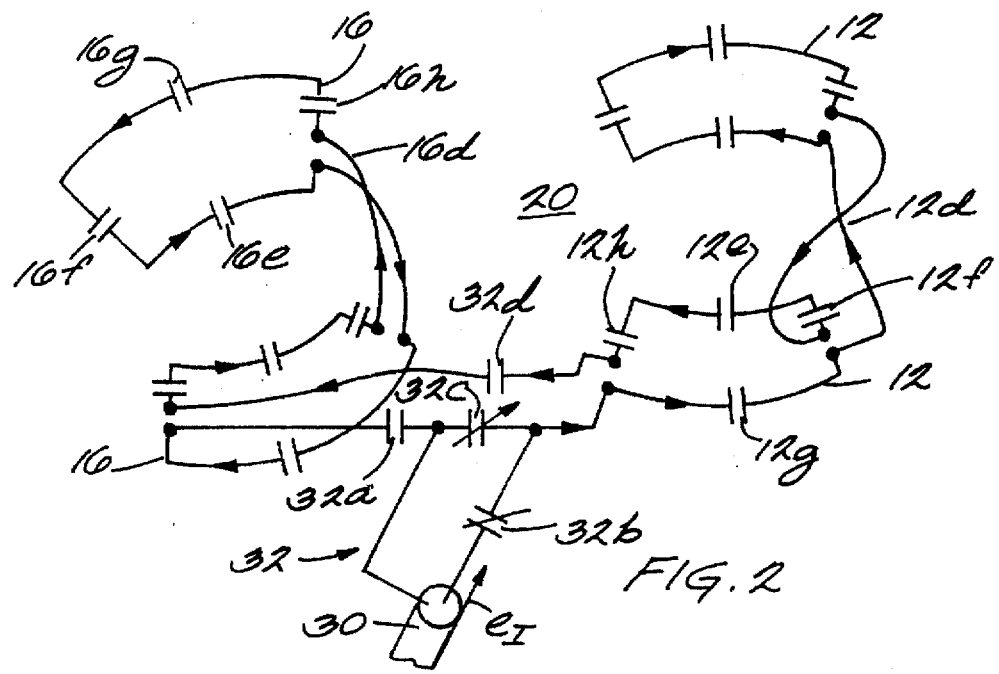
FIG. 2 is a schematic diagram depicting the I-channel referred to above for the embodiment of FIG. 1.

Referring to FIG. 2, there are shown I-channel loops 12 and 16, of RF coil components 10a and 10b, respectively, coupled to receive an RF excitation signal $e_I$ through coaxial cable 30 and a matching network 32. The two loops 12 and the two loops 16 are interconnected by means of conductive paths 12d and 16d, respectively, so that current respectively flows therearound as indicated in FIG. 2. Current flow through respective arc segments of the I-channel loops causes corresponding magnetic field components to be generated in the imaging space 20. These field components will substantially cancel each other outside the X-Y or transverse plane, but will be additive therein to provide a circularly polarized $B_1$ field.

FIG. 2 further shows components of the closed conductive loops 12 and 16 provided with respective capacitive elements 12e–h and 14e–h, as respectively shown. The capacitances provided by such capacitive elements, together with the inductance of the respective loops, provide the RF system with a selected resonant frequency. For the embodiment, the resonant frequency is usefully selected to be on the order of 21 MHz, although other frequencies may alteratively be used.

Referring further to FIG. 2, there is shown network 32 comprising capacitors 32a–32d, capacitors 32b and 32c being adjustable. While not shown in FIG. 2, it is to be understood that the Q-channel loops 14 and 18 are each energized by an excitation signal $e_Q$, which is identical to signal $e_I$ except that it is delayed by 90 degrees in phase therefrom.

Figure 3:
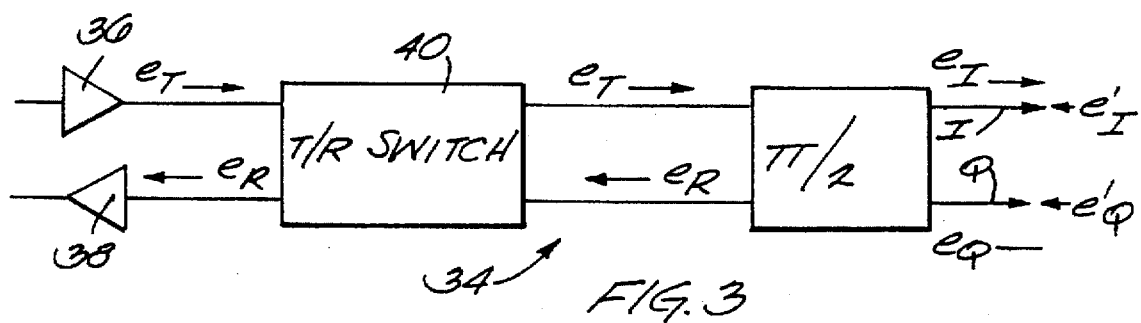
FIG. 3 is a simplified diagram depicting an RF excitation/reception circuit for use with the embodiment of FIG. 1.

Referring to FIG. 3, there is shown a conventional transmit/receive circuit 34 for an MR system. Circuit 34 includes an RF transmit amplifier 36, a receive amplifier 38, a transmit/receive (T/R) switch 40 and a delay device 42 for providing respective I- and Q-channel excitation signals. During an MR pulse sequence, transmit amplifier 36 is operated to generate the RF signal $e_T$. Synchronously therewith, the T/R switch 40 is operated to couple the RF excitation signal to the delay device 42. Device 42 passes the signal $e_T$ to the I-channel as the excitation signal $e_I$ while delaying the signal $e_T$ by 90 degrees to provide the Q-channel excitation signal $e_Q$.

During the acquisition phase of the MR pulse sequence, received MR signal components $e'_I$ and $e'_Q$ are respectively detected by the I-channel and Q-channel loops of the RF coils, and coupled back to device 42. Device 42 operates on $e'_I$ and $e'_Q$ to produce a resultant received MR signal $e_R$ therefrom, which is coupled to T/R switch 40. During such acquisition phase, switch 40 is operated to couple the received MR signal to receive amplifier 38, which amplifies such signal for further processing in accordance with well known MR techniques.

Figure 4:
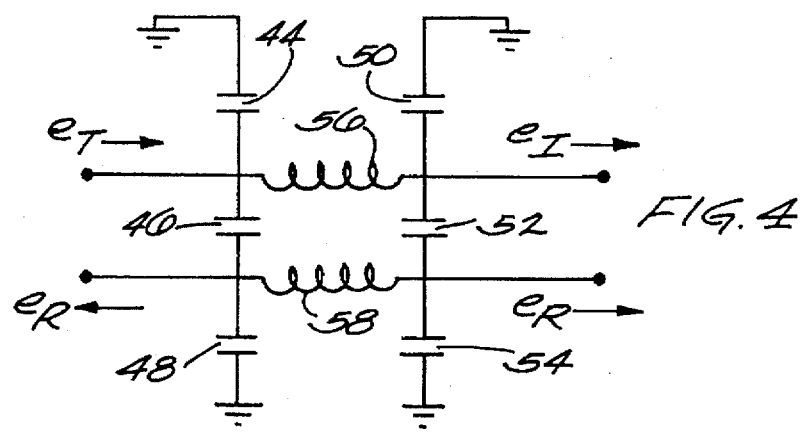
FIG. 4 shows a 90 degree delay device for the circuit shown in FIG. 4.

Delay device 42 comprises a conventional device, one example of which is shown in FIG. 4. Capacitive elements 44–54 are respectively connected to inductive elements 56 and 58, as shown.

Figure 5:
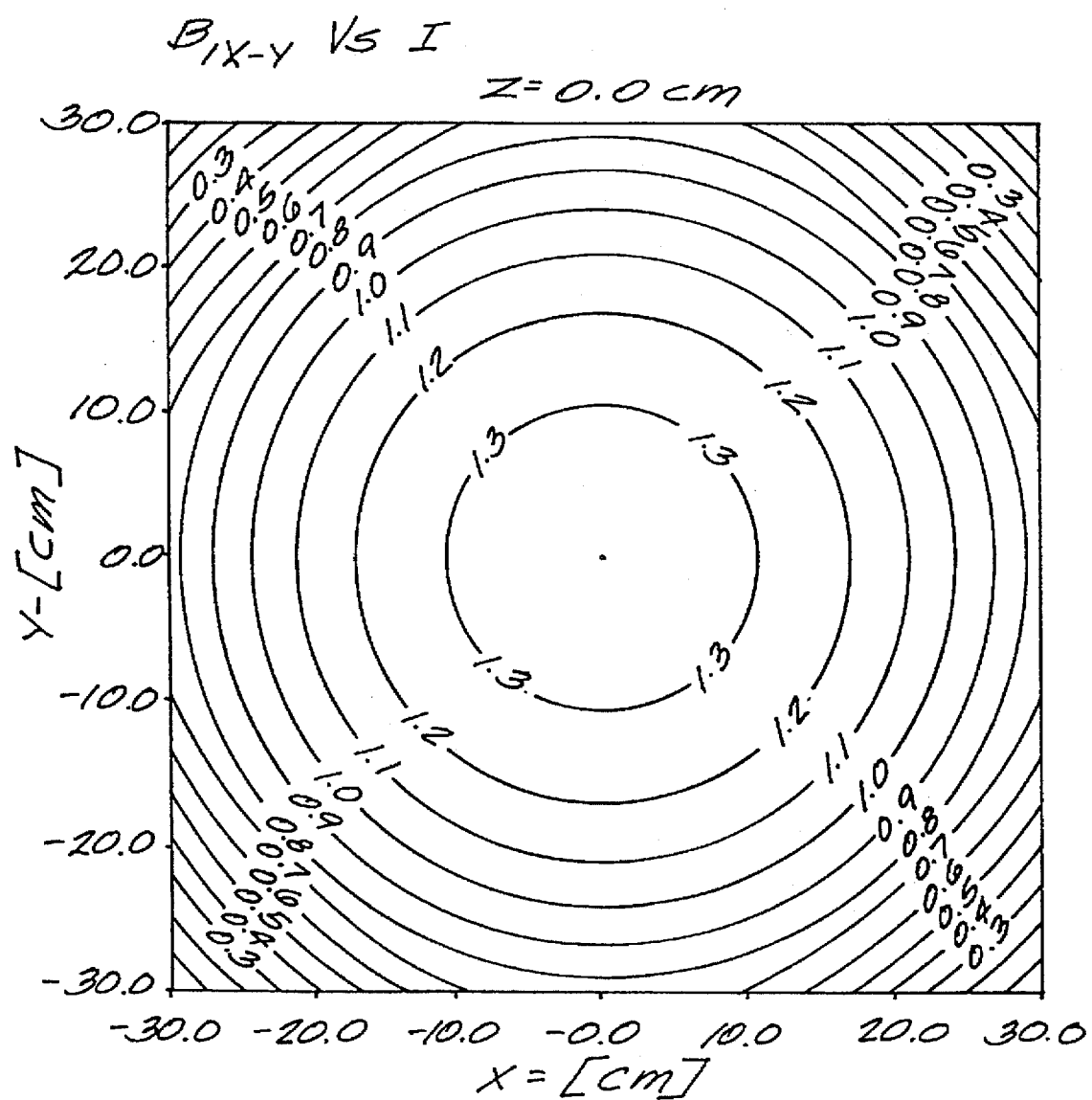
FIG. 5 is a plot of current versus the projection of the RF magnetic field in the X-Y plane provided by the embodiment of FIG. 1.

When the respective conductive loops of RF coil components 10a and 10b are driven by the I- and Q-channel excitation signals, the magnetic field components generated thereby in imaging space 20 are additive therein to provide a resultant circular polarized magnetic field. Such magnetic field comprises the $B_1$ field, and flips the spins in an MR patient or other subject from alignment with the Z-axis into the transverse X-Y plane, in accordance with MR practice. Referring to FIG. 5, there is shown a plot of such resultant magnetic field in the X-Y plane for Z=0.0. Such plot shows the X-Y projection of the magnetic field provided by RF coil system 10 to have very high homogeneity.

Figure 6:
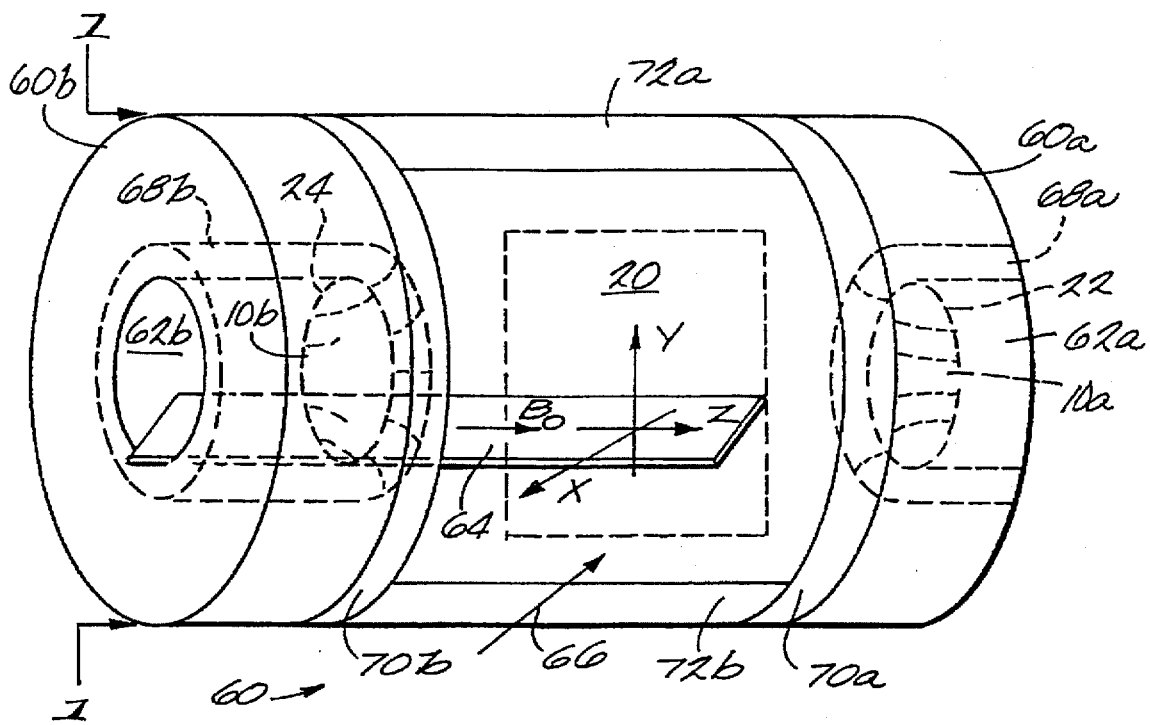
FIG. 6 is a perspective view showing an MR open magnet configuration incorporating the embodiment of FIG. 1.

Referring to FIG. 6, there is shown an open magnet system 60, comprising ring magnet poles 60a and 60b in spaced apart relationship on opposing sides of imaging space 20. Magnets 60a and 60b comprise permanent, superconducting or other type of magnet for producing a static $B_0$ magnetic field, as required for MR imaging, the $B_0$ field being directed along the z-axis. Magnets 60a and 60b are respectively provided with bores or circular apertures 62a and 62b formed therethrough. A patient or other subject (not shown) may enter the imaging space by passing through one of the bores such as bore 62b (front entry) and be supported for imaging on a couch 64 or the like. Alternatively, the subject can enter into imaging space 20 between the magnets 60a and 60b from along the direction of arrow 66 (side entry). Referring further to FIG. 6, there are shown gradient coil assemblies 68a and 68b respectively positioned within ring magnets 60a and 60b around the bores 62a and 62b. Each gradient assembly comprises a set of concentric shielded X-, Y-, and Z-gradients for generating respective X-, Y-, and Z-gradient field components in imaging space 20. Such gradient coil arrangements are well known in the art and are accordingly not shown in detail.

FIG. 6 further shows RF coil components 10a and 10b respectively positioned in adjacent relationship with magnets 60a and 60b, and enclosed in coverings or shrouds 70a and 70b, respectively. Each RF coil component 10a and 10b is supported on a coil form (not shown) so that the inner arc segments 12a and 14a of component 10a are inserted into bore 62a of magnet 60a, and the inner arc segments 16a and 18a of component 10b are inserted into bore 62b of magnet 60b. Respective electrical transmission paths to RF coil components 10a and 10b, such as through cable 30 and network 32 as described above in connection with FIG. 2, can be contained within upper support member 72a or lower support member 72b, which collectively assist in holding magnets 66a and 66b and RF coil components 10a and 10b in place. Thus, such transmission paths do not block or impede side access into the imaging space 20. Also, the minimum diameter of coil components 10a and 10b, which is determined by the diameters of circular paths 22 and 24, is sufficiently large to allow front entry into imaging space 20.

Figure 7:
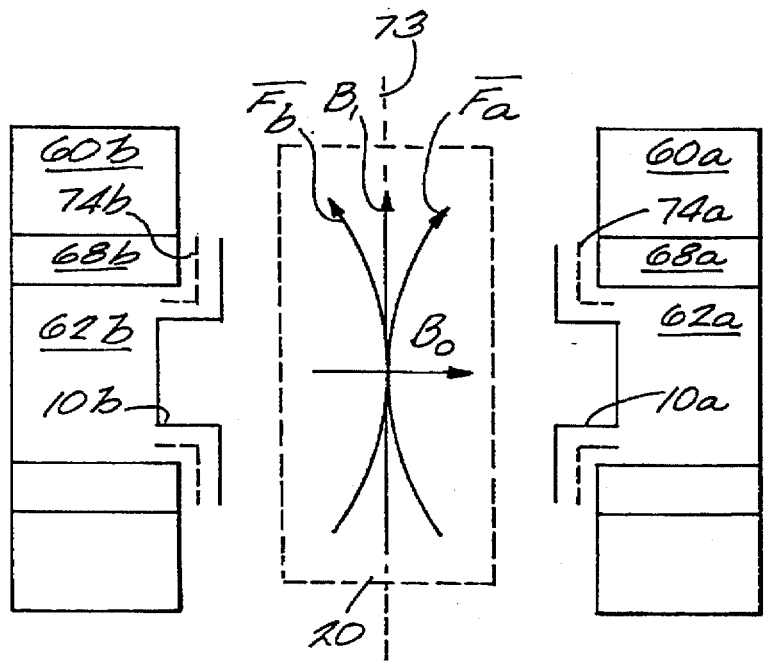
FIG. 7 is a sectional view taken along lines 7—7 of FIG. 6 showing respective field components.

Referring to FIG. 7, there are shown RF field components $F_a$ and $F_b$, which are respectively produced when RF coil components 10a and 10b are energized by the signal $e_I$ as described above. Portions or components of fields $F_a$ and $F_b$ collectively add together, in the imaging space, to provide a resultant field comprising the $B_1$ field. $e_Q$ generates a similar pattern, geometrically rotated around the Z-axis by 90 degrees, to produce $F'_a$ and $F'_b$ which also combine together. In fact, by providing contributions to the total $B_1$ field from both the RF coil components 10a and 10b, the amplitude of $B_1$ provides a higher level of sensitivity and uniformity then would be provided by a coil on only one side of imaging space. As is well-known to those of skill in the art, sensitivity in MR is defined as $B_1$ divided by the level of the current flowing in the coil used to produce the $B_1$ field.

Referring further to FIG. 7, there is shown a shield 74a positioned between RF coil component 10a and gradient coil assembly 68a. There is further shown a shield 74b positioned between RF coil component 10b and gradient coil assembly 68b. The shields 74a and 74b serve to minimize RF losses in the gradient coils.

Figure 8:
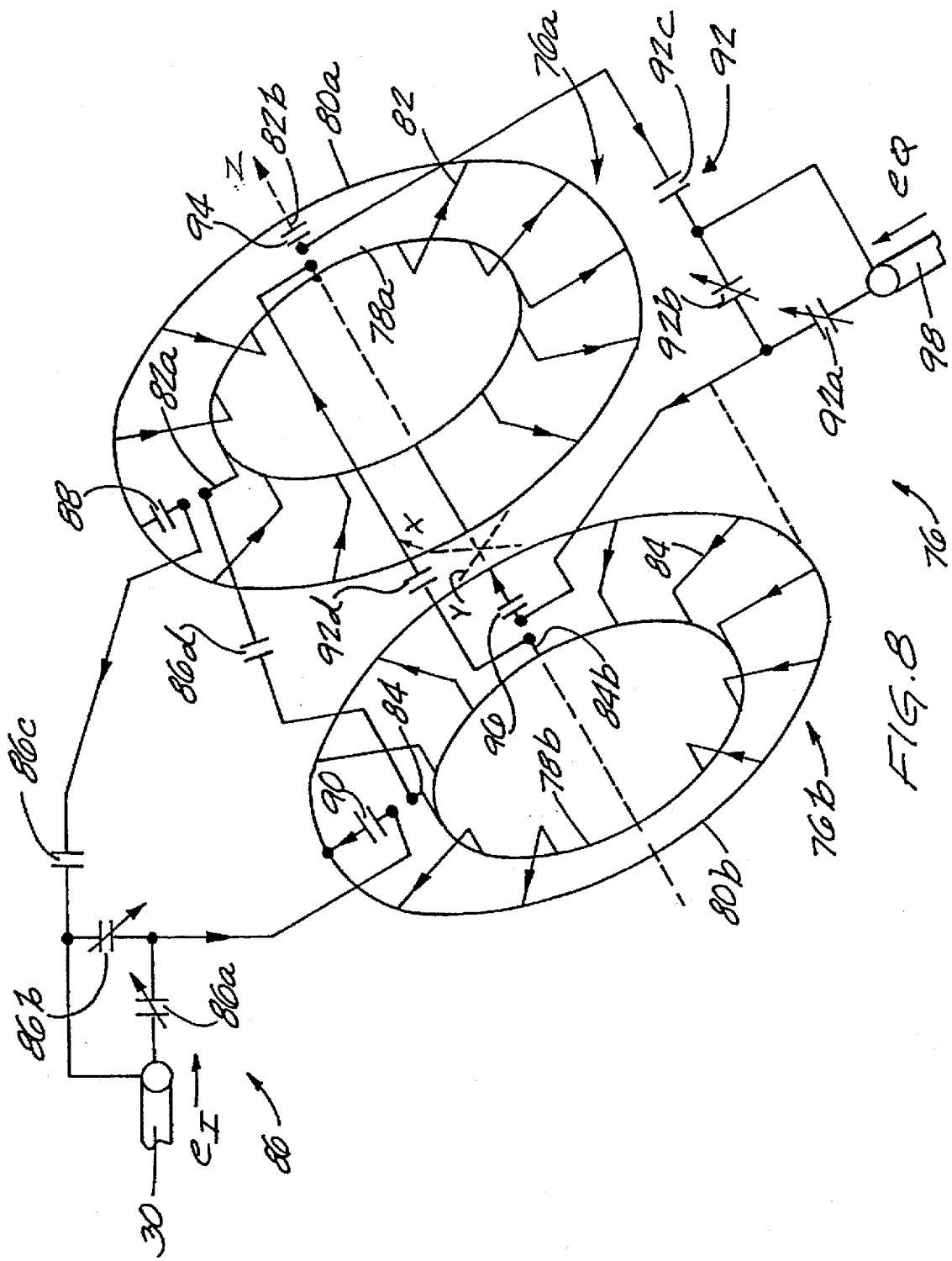
FIG. 8 is a perspective view showing another embodiment of the invention.

Referring to FIG. 8, there is shown a second embodiment 76 of the RF coil of the invention, which comprises RF coil components 76a and 76b. Component 76a comprises conductive end rings 78a and 80a, which both lie in planes parallel to the X-Y plane, and are centered along the Z-axis. Ring 76a has a diameter which is selectively less than the diameter of end ring 80a, and the two end rings are joined by conductive elements 82, which are positioned therearound at regular intervals. The number of conductive elements 82 is preferably divisible by four, such as twelve elements spaced at thirty degree intervals. Preferably also, each conductive element 82 contains a 90 degree angle bend, so that end ring 78a is spaced apart from end ring 80a along the Z-axis, such as by a displacement of 7.5–10.0 centimeters. Thus, two adjacent conductive elements 82 and the segments of end rings 78a and 80a positioned therebetween together comprise a closed conductive loop.

Similarly, RF coil component 76b comprises conductive end rings 78b and 80b, likewise lying in planes parallel to the X-Y plane and centered along the Z-axis. The diameter of end ring 78b is selectively less than the diameter of end ring 80b, and the two end rings are connected by conductive elements 84 which are similar or identical in form and number to the conductive elements 82.

It will be apparent to one of skill in the art that the RF coil components 76a and 76b comprise a variation of the bird cage RF coil referred to above. Such coils may be thought of electrically as comprising a delay line of one wavelength wrapped around a cylinder or other closed path, and connected to itself. Such coils are energized by applying a source of RF power across a capacitive element, in one of the conductors connecting the end rings of the bird cage coil together.

Accordingly, to energize components 76a and 76b, a matching network 86, similar to network 32 described above, is connected to capacitor 88 positioned in conductive element 82a of RF coil component 76a, and also across capacitor 90 positioned in conductive element 84a of RF coil component 76b. The I-channel excitation signal $e_I$ is coupled to coil components 76a and 76b from coaxial cable 30 through network 86, which comprises capacitors 86a–d. Moreover, to drive RF coil arrangement 76 in quadrature, a second matching network 92, comprising capacitors 92a–d, is coupled across capacitors 94 and 96, respectively positioned in conductive element 82b of coil component 76a, and conductive element 84b of coil component 76b. It is to be noted that elements 82b and 84b are positioned 90 degrees around their respective coil components from conductive elements 82a and 84a. The Q-channel excitation signal $e_Q$ is coupled to RF coil components 76a and 76b through network 92, from a coaxial cable 98. Each of the other conductive elements 82 and 84 likewise includes a capacitive element (not shown).

When RF coil components 76a and 76b are respectively excited as described above, they produce magnetic field components in the imaging space respectively similar to field components $F_a$ and $F_b$ shown in FIG. 7. Thus, the RF coil 76 produces a resultant circular polarized field in the X-Y plane, comprising the $B_1$ field, in like manner with RF coil 10. Also, RF coil components 76a and 76b may be positioned with respect to open magnets 62a and 62b, respectively, in like manner as RF coil components 10a and 10b, as shown in FIG. 6. The dimensions of end rings 78a and 78b are sufficiently large to allow front entry therethrough into imaging space 20, and electrical transmission paths between coil components 76a and 76b can be contained in upper and/or lower support members 72a and 72b, allowing side entry.

Obviously many other modifications and variations of the present invention are possible in light of the above teachings. It is therefore to be understood that within the scope of the disclosed concept, the invention may be practiced otherwise than as specifically described.

What is claimed is:

1. An RF coil system for use with an open MR magnet comprising a pair of main magnet components positioned on opposing sides of an imaging space disposed to receive at least a portion of a subject for imaging, said RF coil system comprising:

first and second RF coil components positioned on opposing sides of said imaging space, said first and second coil components each comprising a plurality of closed conductive loops, the conductive loops of each of said RF coil components including inner and outer conductive arc segments, the inner arc segments of an RF coil component and the outer arc segments thereof lying along common inner and outer circular paths respectively; and means for energizing said closed loops of said first and second RF coil components to generate respective corresponding first and second magnetic fields which collectively provide a resultant field comprising a circular polarized field component in a plane intersecting said imaging space and substantially parallel to planes respectively containing said inner and outer circular paths.

2. The RF coil system of claim 1 wherein:

a given one of said closed conductive loops includes a pair of conductive elements, each of said conductive elements connecting an end of the inner arc segment of said given closed loop to a corresponding end of the outer arc segment of said given closed loop, said conductive elements of said given closed loop being electrically isolated from conductive elements of other of said closed loops.

3. The RF coil system of claim 2 wherein:

each of said RF coil components has an associated pair of orthogonal reference axes;

each of said RF coil components comprises a pair of first closed loops positioned along one of its associated reference axes in spaced apart opposing relationship, and a pair of second closed bops positioned along its other associated axis in spaced apart opposing relationship; and said energizing means comprises means for coupling a first energizing signal to each of said first closed loops of said RF coil components and a second energizing signal to each of said second closed loops of each of said RF coil components, said first and second energizing signals being substantially the same except that the second signal is delayed in phase by 90 degrees with respect to said first signal.

4. The RF coil system of claim 3 wherein:

said planes respectively containing inner and outer circular paths of one of said RF coil components are separated by a specified distance along an axis orthogonal to said planes.

5. The RF coil system of claim 4 wherein:

each of the inner and outer arc segments of the closed conductive loops of said RF coil components has an angle on the order of 140 degrees.

6. The RF coil system of claim 1 wherein:

the inner and outer arc segments of a given closed loop are connected together by a pair of conductive elements extending therebetween, each of said extending conductive members also interconnecting inner and outer arc segment of a closed loop adjacent to said given closed loop.

7. The RF coil system of claim 6 wherein:

the inner arc segments of each of said RF coil components are joined together to form a first closed ring and the outer arc segments of each of said RF coil components are joined together to form a second closed ring; and the first and second closed rings of each of said RF coil components are joined together by a plurality of said extending conductive elements, said plurality including first and second conductive elements separated by 90 degrees from each other around their corresponding first and second closed rings.

8. The RF coil system of claim 7 wherein:

said energizing means comprises means for coupling a first energizing signal to each of said first conductive elements of said RF coil components, and a second energizing signal to each of said second conductive elements of said RF coil components, said first and second energizing signals being substantially the same except that the second signal is delayed in phase by 90 degrees with respect to the first signal.

9. An RF coil system for use with an open MR magnet comprising a pair of main magnet components positioned on opposing sides of an imaging space disposed to receive a subject for imaging, said RF coil system comprising:

first and second RF coil components selectively spaced apart from each other on opposite sides of said imaging space, each of said RF coil components comprising a plurality of electrically conductive inner and outer arc segments respectively lying on corresponding inner and outer circular paths, said RF coil components respectively constructed to allow said subject to pass through the inner and outer circular paths of a selected one of said RF coil components into said imaging space, and alternatively to allow said subject to pass between said spaced apart RF coil components, into said imaging space; and means for energizing said first and second RF coil components in quadrature to generate magnetic fields respectively corresponding thereto, said first and second magnetic fields collectively providing a resultant field comprising the $B_1$ magnetic field component in a plane orthogonal to the direction of the main magnetic field component for MR imaging.

10. The RF coil system of claim 9 wherein:

each of said RF coil components has an associated pair of orthogonal reference axes; and each of said RF coil components comprises a pair of first coil loops positioned along one of its associated reference axes in spaced-apart opposing relationship, and a pair of second closed loops positioned along its other associated axis in spaced-apart opposing relationship, each of said closed loops including one of said inner arc segments and one of said outer arc segments.

11. The RF coil system of claim 10 wherein:

said energizing means comprises means for coupling a first energizing signal to each of said first closed loops of said RF coil components and a second energizing signal to each of said second closed loops of said RF coil components, said first and second energizing signals being substantially the same except that the second signal is delayed in phase by 90 degrees with respect to the first signal.

12. The RF coil system of claim 9 wherein:

the inner and outer arc segments of each of said RF coil components are respectively joined together to form respective first and second closed end rings, the first and second end ring of each of said RF coil components being connected together by a selected number of conductive elements extending therebetween and positioned in uniformly spaced-apart relationship.

* * * * *